United States Patent [19]

Friedman

[11] Patent Number: 4,779,966
[45] Date of Patent: Oct. 25, 1988

[54] SINGLE MIRROR PROJECTION OPTICAL SYSTEM

[75] Inventor: Irwin Friedman, Weston, Conn.

[73] Assignee: The Perkin-Elmer Corporation, Norwalk, Conn.

[21] Appl. No.: 684,760

[22] Filed: Dec. 21, 1984

[51] Int. Cl.⁴ .................. G02B 17/00; G02B 00/00
[52] U.S. Cl. .................................. 350/442; 350/1.2; 350/463
[58] Field of Search .................. 350/442–444, 350/463, 464, 465

[56] References Cited

U.S. PATENT DOCUMENTS

| | | | |
|---|---|---|---|
| 3,602,578 | 8/1971 | Tibbetts et al. | 350/464 |
| 3,748,015 | 7/1973 | Offner | 350/444 X |
| 4,171,871 | 10/1979 | Dill et al. | 350/444 |
| 4,226,501 | 10/1980 | Shafer | 350/505 |
| 4,293,186 | 10/1981 | Offner | 350/444 X |

*Primary Examiner*—John K. Corbin
*Assistant Examiner*—Scott J. Sugarman
*Attorney, Agent, or Firm*—Thomas P. Murphy; Edwin T. Grimes; Francis L. Masselle

[57] ABSTRACT

A well corrected ring field catadioptric optical system utilizing refractive elements of the same glass type. A virtual relay corrected for axial and lateral primary color incorporates an air-surface doublet and two field lenses to correct for field aberrations to provide a well corrected ring field virtual image. A spherical mirror is used to make the virtual image accessible.

10 Claims, 2 Drawing Sheets

SINGLE MIRROR PROJECTION OPTICAL SYSTEM

BACKGROUND OF THE INVENTION

A ring field optical system is one which provides an annular zone centered about the optical axis wherein images formed in the annular zone are optically well corrected. Ring field systems have found important use in the field of microlithography wherein circuit patterns on a mask in the object plane may be projected without distortion onto the sensitized surface of a silicon wafer in the image plane. Ring field systems are disclosed in general by Scott in U.S. Pat. No. 3,821,763. Ring field systems of the type used in microlithography are disclosed by Offner in U.S. Pat. Nos. 3,748,015 and 4,293,186. All three patents are assigned to the assignee of the present application, and the disclosures of which are incorporated by reference herein. Both of the patents used in microlithography disclose an off-axis annular field optical system for forming in accurate micro detail an image of an object at unit magnification with high resolution. Each employs the concept of convex and concave mirrors in face-to-face relationship with their centers of curvature being more or less concentric. Both systems and particularly the latter were designed to function over a relatively wide radiation bandwidth, i.e., each system remains reasonably well corrected over a wide spectral band.

As microlithography has developed more and more circuits are being packed into each integrated circuit. This requires that the lines of the circuit patterns used in forming such circuits be exceedingly small, i.e. of the order of one micron or less. As is well known this requires use of the lower end of the UV spectrum since it is at this end that image resolution or sharpness is greatest. Recognizing this the industry is now utilizing nearly monochromatic light in the deep UV as the radiation source in mask projection systems. Such sources may be provided by a single line of a mercury lamp or lasers such as the excimer laser.

The present invention relates to a ring field optical system designed to function with such monochromatic radiation sources. In addition, it provides demagnification of the object at the image plane.

BRIEF SUMMARY OF THE INVENTION

The present invention relates to a ring field catadioptric optical system which utilizes refractive elements all of the same glass type to form a well corrected ring field virtual image. A spherical mirror is used to make the virtual image accessible.

In carrying out the present invention an achromat of the Schupmann (Refer R. Kingslake "Lens Design Fundamentals", Academic Press 1978 Page 89) variety having a field lens positioned to correct for lateral color is compounded to provide a virtual relay which is configured in such a manner as to correct not only axial and lateral color but also the third and fifth order spherical aberration and coma as well as the chromatic variation of third and fifth order spherical aberration and coma. The virtual image of the relay is made accessible by a spherical mirror positioned to be nearly concentric with the virtual image. The virtual object is made accessible by the addition of refractive power in object space. The field aberrations of astigmatism, distortion, curvature of field and telecentricity in both object and image space are corrected by the incorporation of an airspaced doublet in object space and two field lenses, one located near the object and the other near the image. Object and image may be made accessible for use in a microlithograph projection system by the further addition of two fold mirrors.

The design of the present invention is well corrected over a bandwidth of 10A which is much wider than can be achieved with conventional refractive types such as the double gauss or Petzval of all the same glass type which would have a band width of 0.1A. In the deep UV only one practical glass type is available; that is fused silica. With this single glass type available the axial color can not be corrected thus resulting in a very narrow band width. In the herein described design the axial and lateral color are corrected even though a single glass type is used.

DESCRIPTION

Figure 1:
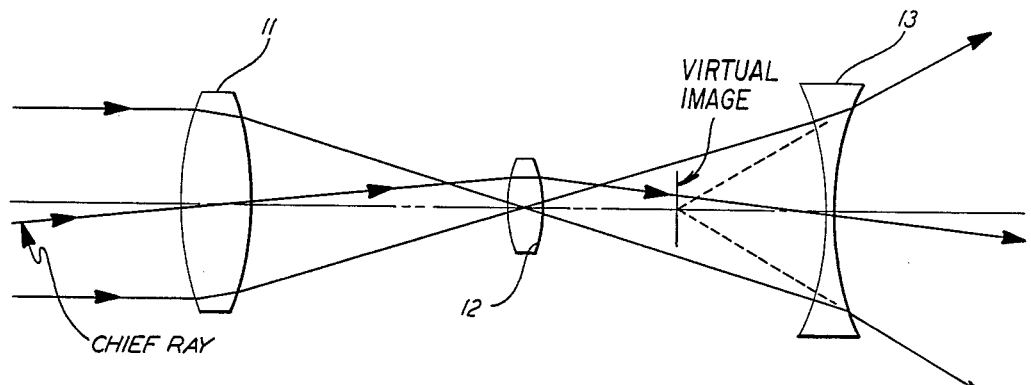
FIG. 1 illustrates a Schupmann achromat with field lens useful in understanding the present invention.

Referring now to FIG. 1 there is shown an achromat which essentially comprises a positive lens 11 and a negative lens 13 both of the same glass type. Such a system which corrects for axial color is known as the Schupmann achromat and is the only known acromat that utilizes a single glass type. Before the Shupmann design the only known refractive acromats required two different types of glass, i.e. a positive element of crown glass and a negative element of flint glass both of appropriate power.

In FIG. 1 a field lens 12 is added and positioned to cause the chief ray through the center of the positive lens 11 to go through the center of the negative lens 13. This corrects for primary lateral color which the two element Schupmann achromat does not.

Figure 2:
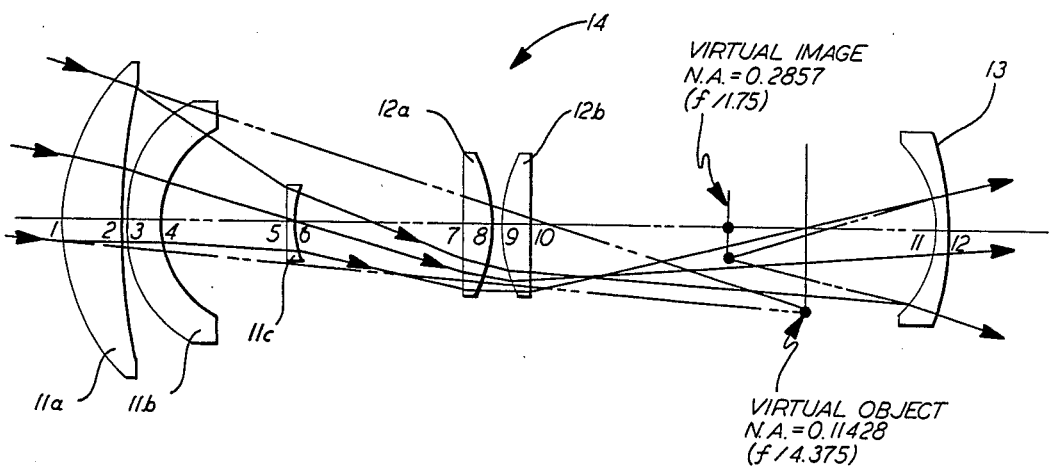
FIG. 2 is a virtual relay according to the present invention.

FIG. 2 illustrates a virtual relay 14. In addition to correcting for axial and lateral color the virtual relay 14 of FIG. 2 corrects for third and fifth order spherical aberration and coma, as well as the chromatic variation of third and fifth order spherical aberration and coma. Virtual relay 14 is derived by compounding the elements of the positive lens 11 and the field element 12 of the Schupmann design of FIG. 1.

Thus, virtual relay 14 comprises three positive lenses 11A, 11B and 11C, the compounded positive lens, two field lenses 12A and 12B and the negative lens 13. A field stop is disposed just after lens 11C. These elements are so configured and positioned as to provide the correction described above.

TABLE I is an example of construction data for the virtual relay 14 of FIG. 2 which follows:

TABLE I

0.4X VIRTUAL RELAY
N.A. AT OBJECT 0.1143
N.A. AT IMAGE 0.2857

| SURFACE NO. FROM OBJECT | RADIUS (MM) | DISTANCE TO NEXT SURFACE (MM) | MATERIAL |
|---|---|---|---|
| 0 | PLANE | −509.3784 | AIR |
| 1 | 146.8335 | 40.0000 | FUSED SILICA |
| 2 | 437.5290 | 3.0000 | AIR |
| 3 | 97.8688 | 25.0000 | FUSED SILICA |
| 4 | 74.8220 | 87.5000 | AIR |
| 5 | 706.1405 | 5.0000 | FUSED SILICA |
| 6 | 63.5693 | 113.9107 | AIR |
| 7 | 849.0004 | 20.0000 | FUSED SILICA |
| 8 | −125.8509 | 8.1384 | AIR |
| 9 | 110.5940 | 20.0000 | FUSED SILICA |
| 10 | −719.2014 | 276.6173 | AIR |
| 11 | −85.6669 | 10.0000 | FUSED SILICA |
| 12 | −197.8643 | −150.0000 | AIR |
| 13 | INF | 0.0 | AIR |

STOP IS 4.0 MM AFTER SURFACE 6

The virtual relay 14 while well corrected on axis and for lateral color, is not corrected for field aberrations. In addition, it has a virtual object and image. The system of FIG. 3 corrects the field aberrations and provides a real object and image. This is accomplished in the following way.

By further compounding of the Schupmann positive element to five elements, 11A, 11B, 11C, 11D, and 11E additional positive power is added thus resulting in the virtual object becoming real and accessible.

Figure 3:
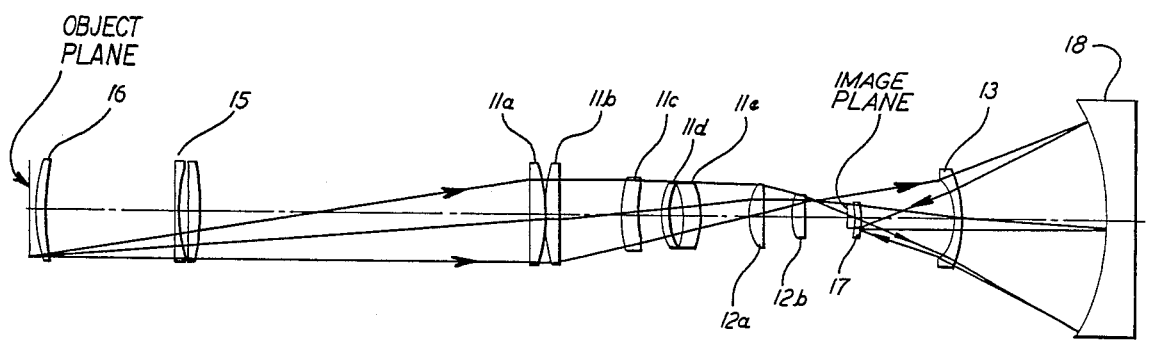
FIG. 3 is a fully corrected ring field optical system according to the present invention.

A spherical mirror 18 is positioned within the design of FIG. 3 so that it is nearly concentric with the virtual image located on the optical axis in the image plane thus making the virtual image real and accessible.

The spherical mirror 18 provides a ring field, i.e. an off axis real image of the object that is well corrected within the salt areas of an annular ring which is concentric about the optical axis of the system. The well corrected ring field is focused at the image plane as shown in FIG. 3.

It should also be noted that the spherical mirror 18 provides a double of the axis color correction of the negative lens 13 since the rays pass through this element twice. The additional axial color correction thus provided balances the axial color introduced by the additional power of the Schupmann positive element. The Schupmann positive element 11 has been further compounded and increased in power in order to render the object real.

In order to correct the field aberrations of astigmatism, distortion and curvature-of-field and the chromatic variations thereof, as well as the telecentricity of both the object and image, an air-spaced doublet 15 and field lenses 16 and 17 are added.

The correction of these aberrations is interrelated such that the correction of any particular aberration can not be attributed completely to any particular element. It may be said, however, that the astigmatism and the chromatic variation thereof is esentially connected by air-spaced doublet 15. The power of the field lens 16 essentially corrects the curvature-of-field and telecentricity of the object. The bending of the field lens 16 essentially corrects the distortion. The field lens 17 essentially corrects the telecentricity of the image.

The complete design comprised of the compounded Schupmann positive elements, 11A, 11B, 11C, 11D and 11E; both elements of the Schupmann field lens 12A and 12B; the Schupmann negative element 13; the spherical mirror 18, the air-spaced doublet 15, and the two field lenses 16 and 17 were reoptimized as a complete system to achieve the best overall balance of the aberrations and the chromatic variations thereof.

Figure 4:
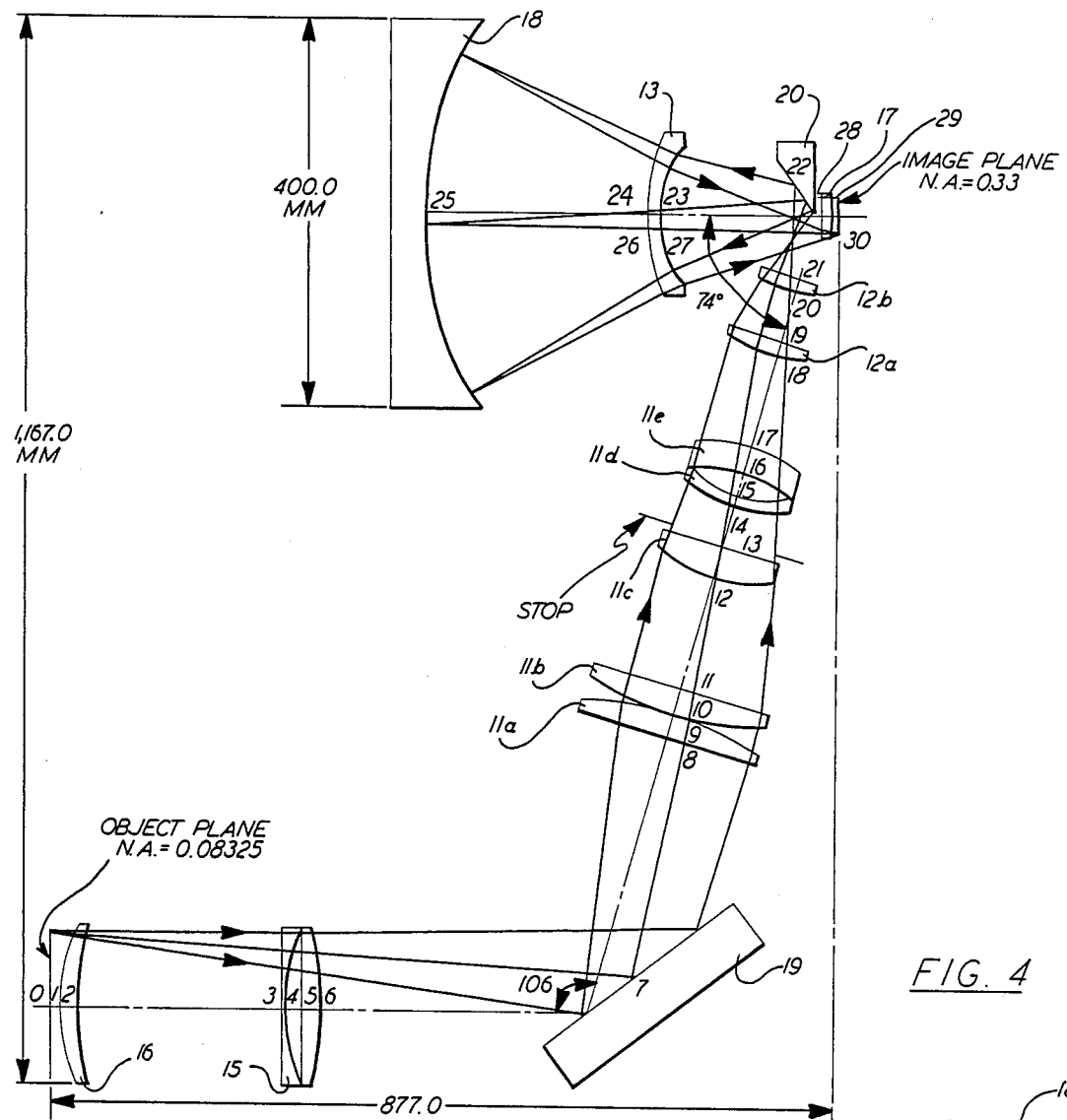
FIG. 4 is the optical system of FIG. 3 incorporating two fold mirrors to provide convenient accessibility of the object and image.

FIG. 4 illustrates an optical system identical to that of FIG. 3 save for the addition of two folding mirrors 19 and 20 to make the image more accessible and adaptable for use in a microlithography main projection system. In addition, a more compact arrangement results. One fold 19 is located between the air-spaced doublet 15 and the compounded Schupmann positive element 11. The other fold 20 is located between the Schupmann field lens 12 and the Schupmann negative lens 13. Thus in this system the object in the object plane is reflected by folding mirror 19 and the image by fold 20 before undergoing the same reflection from the spherical mirror 18 as in the system of FIG. 3. The image then appears as a well corrected off axis image at image plane 30.

The surfaces of the elements of the optical systems are numbered from 1 to 30 in FIG. 4 to ease in understanding prescriptions set forth in TABLES II and III for the situations of N.A=0.33 and N.A.=0.40, respectively. FIG. 4 illustrates the optical system where N.A.=0.33 and the parameters therefore shown in more detail in TABLE II. TABLE III illustrates the required parameters for the case N.A.=0.40. Naturally, other parameters would be required for various other values of the normal aperture N.A. and TABLES II and III are given by way of example only.

TABLE II

SINGLE MIRROR PROJECTION SYSTEM
N.A. = 0.33 AT IMAGE

| SURFACE NO. FROM OBJECT | RADIUS (MM) | DISTANCE TO NEXT SURFACE (MM) | MATERIAL |
|---|---|---|---|
| 0 | PLANE | 15.0106 | AIR |
| 1 | 250.7601 | 20.0000 | FUSED SILICA |
| 2 | 495.7365 | 220.1050 | AIR |
| 3 | 1316.0222 | 7.0000 | FUSED SILICA |
| 4 | 256.8690 | 17.0000 | AIR |
| 5 | 2094.2528 | 20.0000 | FUSED SILICA |
| 6 | −440.3327 | 300.0000 | AIR |
| 7 | PLANE | −316.9289 | AIR |
| 8 | 3427.7484 | −25.0000 | FUSED SILICA |
| 9 | 388.2743 | −1.0000 | AIR |
| 10 | −381.6655 | −25.0000 | FUSED SILICA |
| 11 | −1439.2312 | −136.0369 | AIR |
| 12 | −219.7194 | −30.0000 | FUSED SILICA |
| 13 | −553.6858 | −50.0369 | AIR |
| 14 | −125.2624 | −10.0000 | FUSED SILICA |
| 15 | −103.1942 | −25.0000 | AIR |
| 16 | 190.2020 | −30.0000 | FUSED SILICA |
| 17 | 205.2266 | −103.7988 | AIR |
| 18 | −145.9760 | −20.0000 | FUSED SILICA |
| 19 | 1300.6540 | −50.6144 | AIR |
| 20 | −101.4453 | −20.0000 | FUSED SILICA |
| 21 | −561.9992 | −72.5311 | AIR |
| 22 | PLANE | 180.0000 | AIR |
| 23 | −111.2179 | 10.0000 | FUSED SILICA |
| 24 | −238.5001 | 250.0000 | AIR |
| 25 | −400.0000 | −250.0000 | AIR |
| 26 | −238.5001 | −10.0000 | FUSED SILICA |
| 27 | −111.2179 | −185.0000 | AIR |
| 28 | 479.8622 | −10.0000 | FUSED SILICA |
| 29 | 182.4330 | −6.9982 | AIR |
| 30 | PLANE | | AIR |

STOP IS 3.5 MM AFTER SURFACE 13

TABLE III

SINGLE MIRROR PROJECTION SYSTEM
N.A. = 0.40 AT IMAGE

| SURFACE NO. FROM OBJECT | RADIUS (MM) | DISTANCE TO NEXT SURFACE (MM) | MATERIAL |
|---|---|---|---|
| 0 | PLANE | 15.0034 | AIR |
| 1 | 191.1886 | 20.0000 | FUSED SILICA |
| 2 | 380.6867 | 156.2513 | AIR |
| 3 | −7886.6829 | 7.0000 | FUSED SILICA |
| 4 | 193.8456 | 19.0000 | AIR |
| 5 | −1841.8397 | 20.0000 | FUSED SILICA |
| 6 | −288.5379 | 300.0000 | AIR |
| 7 | PLANE | −219.4054 | AIR |
| 8 | 1910.4091 | −25.0000 | FUSED SILICA |
| 9 | 380.8600 | −1.0000 | AIR |
| 10 | −372.7529 | −25.0000 | FUSED SILICA |
| 11 | −1055.4615 | −259.5532 | AIR |
| 12 | −261.0379 | −30.0000 | FUSED SILICA |
| 13 | −34966.4670 | −29.9486 | AIR |
| 14 | −113.1974 | −10.0000 | FUSED SILICA |
| 15 | −100.0095 | −32.0000 | AIR |
| 16 | 229.8248 | −30.0000 | FUSED SILICA |
| 17 | 275.3900 | −49.9961 | AIR |
| 18 | −190.6421 | −20.0000 | FUSED SILICA |
| 19 | 1336.8166 | −91.1971 | AIR |
| 20 | −85.2476 | −20.0000 | FUSED SILICA |
| 21 | −1424.8770 | −65.7494 | AIR |
| 22 | PLANE | 180.0000 | AIR |
| 23 | −113.1155 | 10.0000 | FUSED SILICA |
| 24 | −244.2444 | 150.0000 | AIR |
| 25 | −300.0000 | −150.0000 | AIR |
| 26 | −244.2444 | −10.0000 | FUSED SILICA |
| 27 | −113.1155 | −185.0000 | AIR |
| 28 | −627.9968 | −10.0000 | FUSED SILICA |
| 29 | 165.7158 | −6.9995 | AIR |
| 30 | PLANE | | AIR |

STOP IS 17.0 MM AFTER SURFACE 13

TABLES IV and V are also included below. TABLE IV illustrates the performance of the ring field optical system of FIG. 4 for the conditions N.A.=0.33 and TABLE V illustrates the performance of the ring field optical system of FIG. 4 for the condition N.A.=0.40.

TABLE IV

N.A. AT OBJECT 0.083
N.A. AT IMAGE 0.33

| RADIUS OF ANNULUS (MM) AT IMAGE | RMS WAVE ABERRATION (WAVELENGTH UNITS) WAVELENGTH (ANGSTROM UNITS) | | |
|---|---|---|---|
| | 3075A | 3080A | 3085A |
| 18.75 | 0.092 | 0.101 | 0.114 |
| 19.00 | 0.076 | 0.082 | 0.096 |
| 19.50 | 0.048 | 0.048 | 0.061 |
| 20.00 | 0.038 | 0.026 | 0.035 |
| 20.50 | 0.059 | 0.045 | 0.044 |
| 21.00 | 0.092 | 0.081 | 0.079 |
| 21.25 | 0.114 | 0.102 | 0.100 |

TABLE V

N.A. AT OBJECT 0.1
N.A. AT IMAGE 0.40

| RADIUS OF ANNULUS (MM) AT IMAGE | RMS WAVE ABERRATION (WAVELENGTH UNITS) WAVELENGTH (ANGSTROM UNITS) | | |
|---|---|---|---|
| | 3075A | 3080A | 3085A |
| 19.0 | 0.125 | 0.136 | 0.149 |
| 19.5 | 0.074 | 0.082 | 0.087 |
| 20.0 | 0.033 | 0.052 | 0.055 |
| 20.5 | 0.085 | 0.080 | 0.076 |
| 21.0 | 0.142 | 0.137 | 0.134 |

While not limited to such the ring field optical system of FIGS. 3 and 4 have a magnification of 0.25. However, other magnifications are possible and are considered to form a part of this invention. A magnification of 0.25 is described by way of example only.

Figure 5:
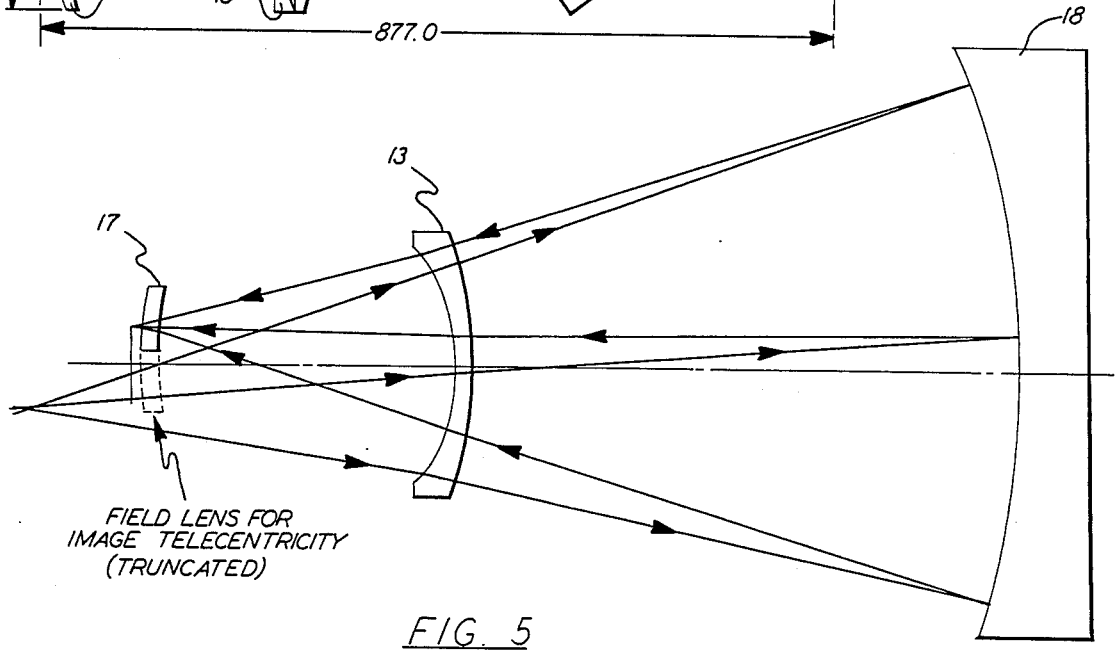
FIG. 5 is a detail of FIG. 3 of the image plane.

For purposes of clarification, FIG. 5 is a detailed showing of the image plane shown in FIG. 3 which illustrates the truncation of element 17 such that the rays directed toward mirror 18 do not pass through element 17.

There has been disclosed a ring field system utilizing refractive elements of a single material and a single spherical mirror. The ring field system of the present invention which is adaptable for use in mask projection systems for the fabrication of integrated circuits and is well connected over a bandwidth of 10A based on a single line mercury or excimer laser source.

Other modifications of the present invention are possible in light of the above description which should not be construed as placing limitations on the invention other than those set forth in the claims which follow.

What is claimed is:

1. A ring field optical system, comprising:
   refractive element means comprised of the same optical material providing a well corrected virtual image of an object at the optical axis;
   said refractive element means comprising;
   first lens means correcting for axial color in the system;
   second lens means correcting for field aberrations in the system;
   third lens means for providing telecentricity in object and image space of the system; and
   spherical mirror means positioned relative to said refractive element means such that its center of curvature is nearly coincident with said virtual image for projecting a real image of said virtual image at an off axis position.

2. A ring field optical system according to claim 1 wherein said first lens means includes means for increasing power in the object field to make the object real.

3. A ring field optical system according to claim 2 wherein said first lens means comprises:
   positive lens means;
   negative lens means;
   said positive and negative lens means together correcting for axial color in the system; and
   field lens means disposed between said positive and negative lens means correcting for lateral color in the system.

4. A ring field system according to claim 3 wherein said second lens means comprises an airspaced doublet.

5. A ring field system according to claim 4 wherein said optical system provides demagnification between object and image.

6. A ring field system according to claim 5 wherein said spherical mirror means doubles the axial color correction of said negative lens means.

7. A ring field system according to claim 6 further comprising:
   a first fold mirror disposed before said positive lens means;
   a second fold mirror disposed before said negative lens means; and
   said fold mirrors providing easy accessibility to said real image.

8. A ring field optical system according to claim 7 characterized by the following construction data for the case N.A.=0.33;

SINGLE MIRROR PROJECTION SYSTEM
N.A. = 0.33 AT IMAGE

| SURFACE NO. FROM OBJECT | RADIUS (MM) | DISTANCE TO NEXT SURFACE (MM) | MATERIAL |
|---|---|---|---|
| 0 | PLANE | 15.0106 | AIR |
| 1 | 250.7601 | 20.0000 | FUSED SILICA |
| 2 | 495.7365 | 220.1050 | AIR |
| 3 | 1316.0222 | 7.0000 | FUSED SILICA |
| 4 | 256.8690 | 17.0000 | AIR |
| 5 | 2094.2528 | 20.0000 | FUSED SILICA |
| 6 | −440.3327 | 300.0000 | AIR |
| 7 | PLANE | −316.9289 | AIR |
| 8 | 3427.7484 | −25.0000 | FUSED SILICA |
| 9 | 388.2743 | −1.0000 | AIR |
| 10 | −381.6655 | −25.0000 | FUSED SILICA |
| 11 | −1439.2312 | −136.0369 | AIR |
| 12 | −219.7194 | −30.0000 | FUSED SILICA |
| 13 | −553.6858 | −50.0369 | AIR |
| 14 | −125.2624 | −10.0000 | FUSED SILICA |
| 15 | −103.1942 | −25.0000 | AIR |
| 16 | 190.2020 | −30.0000 | FUSED SILICA |
| 17 | 205.2266 | −103.7988 | AIR |
| 18 | −145.9760 | −20.0000 | FUSED SILICA |
| 19 | 1300.6540 | −50.6144 | AIR |
| 20 | −101.4453 | −20.0000 | FUSED SILICA |
| 21 | −561.9992 | −72.5311 | AIR |
| 22 | PLANE | 180.0000 | AIR |
| 23 | −111.2179 | 10.0000 | FUSED SILICA |
| 24 | −238.5001 | 250.0000 | AIR |
| 25 | −400.0000 | −250.0000 | AIR |
| 26 | −238.5001 | −10.0000 | FUSED SILICA |
| 27 | −111.2179 | −185.0000 | AIR |
| 28 | 479.8622 | −10.0000 | FUSED SILICA |
| 29 | 182.4330 | −6.9982 | AIR |
| 30 | PLANE | | AIR |

STOP IS 3.5 MM AFTER SURFACE 13

9. A ring field system according to claim 7 having the following construction data for the condition N.A.=0.40;

SINGLE MIRROR PROJECTION SYSTEM
N.A. = 0.40 AT IMAGE

| SURFACE NO. FROM OBJECT | RADIUS (MM) | DISTANCE TO NEXT SURFACE (MM) | MATERIAL |
|---|---|---|---|
| 0 | PLANE | 15.0034 | AIR |
| 1 | 191.1886 | 20.0000 | FUSED SILICA |
| 2 | 380.6867 | 156.2513 | AIR |
| 3 | −7886.6829 | 7.0000 | FUSED SILICA |
| 4 | 193.8456 | 19.0000 | AIR |
| 5 | −1841.8397 | 20.0000 | FUSED SILICA |
| 6 | −288.5379 | 300.0000 | AIR |
| 7 | PLANE | −219.4054 | AIR |
| 8 | 1910.4091 | −25.0000 | FUSED SILICA |
| 9 | 380.8600 | −1.0000 | AIR |
| 10 | −372.7529 | −25.0000 | FUSED SILICA |
| 11 | −1055.4615 | −259.5532 | AIR |
| 12 | −261.0379 | −30.0000 | FUSED SILICA |
| 13 | −34966.4670 | −29.9486 | AIR |
| 14 | −113.1974 | −10.0000 | FUSED SILICA |
| 15 | −100.0095 | −32.0000 | AIR |
| 16 | 229.8248 | −30.0000 | FUSED SILICA |
| 17 | 275.3900 | −49.9961 | AIR |
| 18 | −190.6421 | −20.0000 | FUSED SILICA |
| 19 | 1336.8166 | −91.1971 | AIR |
| 20 | −85.2476 | −20.0000 | FUSED SILICA |
| 21 | −1424.8770 | −65.7494 | AIR |
| 22 | PLANE | 180.0000 | AIR |
| 23 | −113.1155 | 10.0000 | FUSED SILICA |
| 24 | −244.2444 | 150.0000 | AIR |

10. A virtual relay comprising first, second, and third positive lenses;
a negative lens;
first and second field lenses disposed between said third positive lens and said negative lens;
said positive lenses and said negative lenses constructed and arranged to correct axial color of the system;
said field lenses constructed and arranged to cause the chief ray through the system to pass through the center of said negative lenses thereby correcting for lateral color in the system;
all of said lenses being made of the same optical material;
said relay having the following construction data;

0.4X VIRTUAL RELAY
N.A. AT OBJECT 0.1143
N.A. AT IMAGE 0.2857

| SURFACE NO. FROM OBJECT | RADIUS (MM) | DISTANCE TO NEXT SURFACE (MM) | MATERIAL |
|---|---|---|---|
| 0 | PLANE | −509.3784 | AIR |
| 1 | 146.8335 | 40.0000 | FUSED SILICA |
| 2 | 437.5290 | 3.0000 | AIR |
| 3 | 97.8688 | 25.0000 | FUSED SILICA |
| 4 | 74.8220 | 87.5000 | AIR |
| 5 | 706.1405 | 5.0000 | FUSED SILICA |
| 6 | 63.5693 | 113.9107 | AIR |
| 7 | 849.0004 | 20.0000 | FUSED SILICA |
| 8 | −125.8509 | 8.1384 | AIR |
| 9 | 110.5940 | 20.0000 | FUSED SILICA |
| 10 | −719.2014 | 276.6173 | AIR |
| 11 | −85.6669 | 10.0000 | FUSED SILICA |
| 12 | −197.8643 | −150.0000 | AIR |
| 13 | INF | 0.0 | AIR |

STOP IS 4.0 MM AFTER SURFACE 6

* * * * *